(12) United States Patent
Kamimura et al.

(10) Patent No.: US 8,022,365 B2
(45) Date of Patent: Sep. 20, 2011

(54) CHARGED PARTICLE BEAM EQUIPMENTS, AND CHARGED PARTICLE BEAM MICROSCOPE

(75) Inventors: Osamu Kamimura, Hino (JP); Hiroya Ohta, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 371 days.

(21) Appl. No.: 12/168,940

(22) Filed: Jul. 8, 2008

(65) Prior Publication Data

US 2009/0014651 A1   Jan. 15, 2009

(30) Foreign Application Priority Data

Jul. 13, 2007  (JP) ................. 2007-184084

(51) Int. Cl.
*H01J 37/28* (2006.01)
*H01J 3/26* (2006.01)
(52) U.S. Cl. ............. 250/311; 250/310; 250/307
(58) Field of Classification Search .......... 250/306–311, 250/396 R, 397
See application file for complete search history.

(56) References Cited

U.S. PATENT DOCUMENTS

| | | | | |
|---|---|---|---|---|
| 4,160,162 | A * | 7/1979 | Muller et al. | 250/311 |
| 4,651,220 | A * | 3/1987 | Hosoi et al. | 358/471 |
| 5,753,913 | A * | 5/1998 | Coene et al. | 250/307 |
| 7,154,091 | B2 * | 12/2006 | Zewail et al. | 250/311 |
| 7,442,931 | B2 * | 10/2008 | Zewail et al. | 250/311 |
| 7,915,583 | B2 * | 3/2011 | Zewail et al. | 250/310 |
| 2002/0099573 | A1 * | 7/2002 | Koguchi et al. | 705/3 |
| 2005/0253069 | A1 * | 11/2005 | Zewail et al. | 250/311 |
| 2008/0017796 | A1 * | 1/2008 | Zewail et al. | 250/307 |
| 2009/0236521 | A1 * | 9/2009 | Zewail et al. | 250/307 |

FOREIGN PATENT DOCUMENTS

EP   1 768 161 A1   3/2007
WO   WO 2005/114693 A1   12/2005

OTHER PUBLICATIONS

R.W. Gerchberg et al., A Practical Algorithm for the Determination of Phase from Image and Diffraction Plan Pictures, Optik, (1972) vol. 35, pp. 237-246.
J.M. Zuo et al., Atomic Resolution Imaging of a Carbon Nanotube from Diffraction Intensities, (2003), Science, vol. 300, pp. 1419-1421.

* cited by examiner

*Primary Examiner* — Bernard E Souw
(74) *Attorney, Agent, or Firm* — Antonelli, Terry, Stout & Kraus, LLP.

(57) ABSTRACT

In an electron microscope to which a phase retrieval method is applied, an image size determined by a pixel size p of a diffraction pattern, a camera length L, and a wavelength λ of an illumination beam is allowed to have a certain relation with an illumination area on a specimen. Further, a beam illumination area or a scanning area of a deflector when a magnified image is observed is set by an illumination adjustment system, so that an image size when the magnified image is used for the phase retrieval method is allowed to have a certain relation with the image size determined by the pixel size of the diffraction pattern, the camera length, and the wavelength of the illumination beam. Accordingly, the information of the diffraction pattern is substantially equal to an object image to be reconstructed.

12 Claims, 6 Drawing Sheets

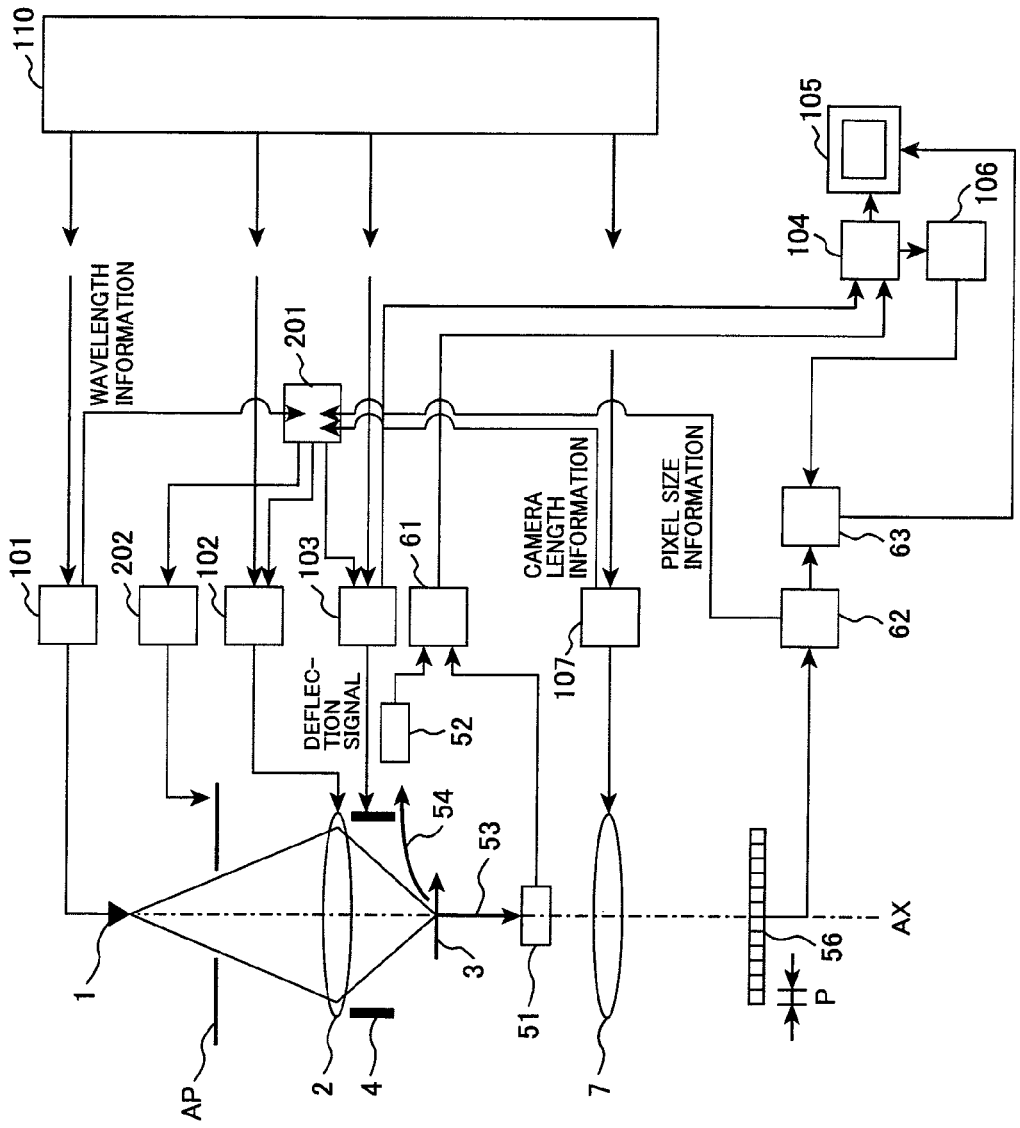
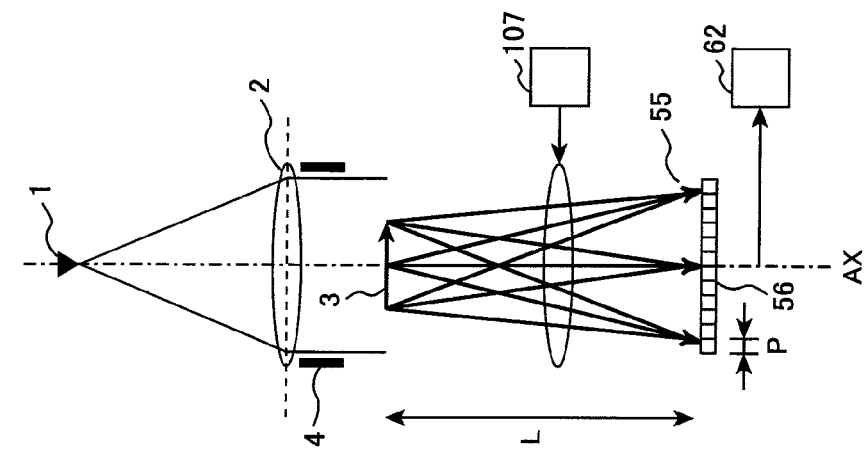

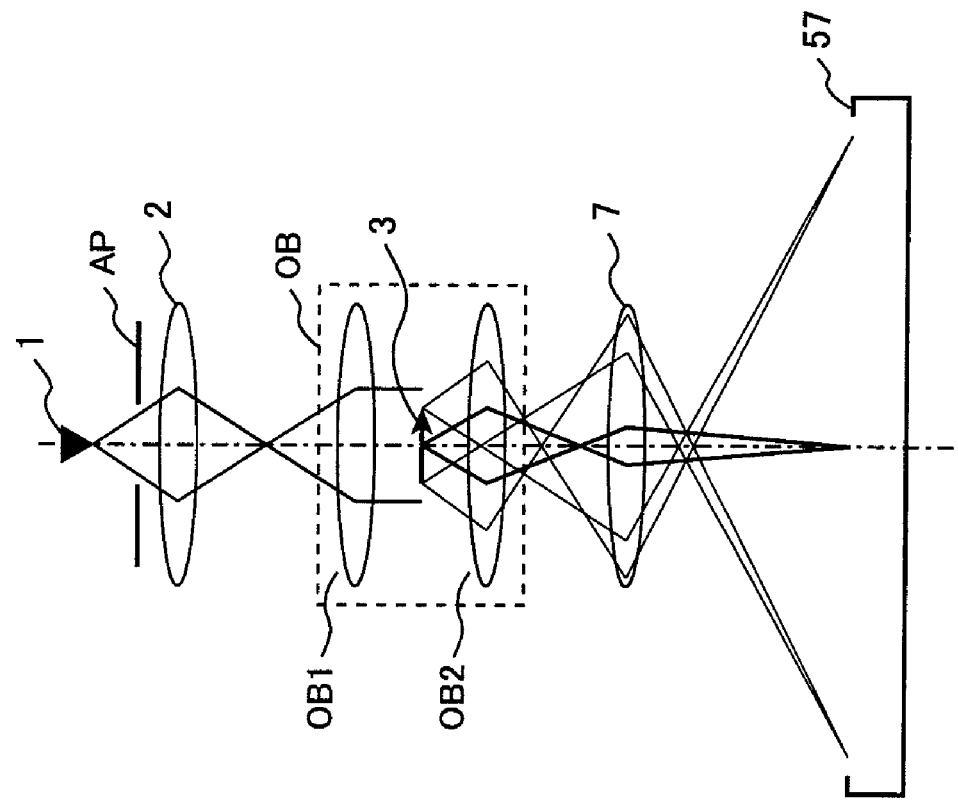
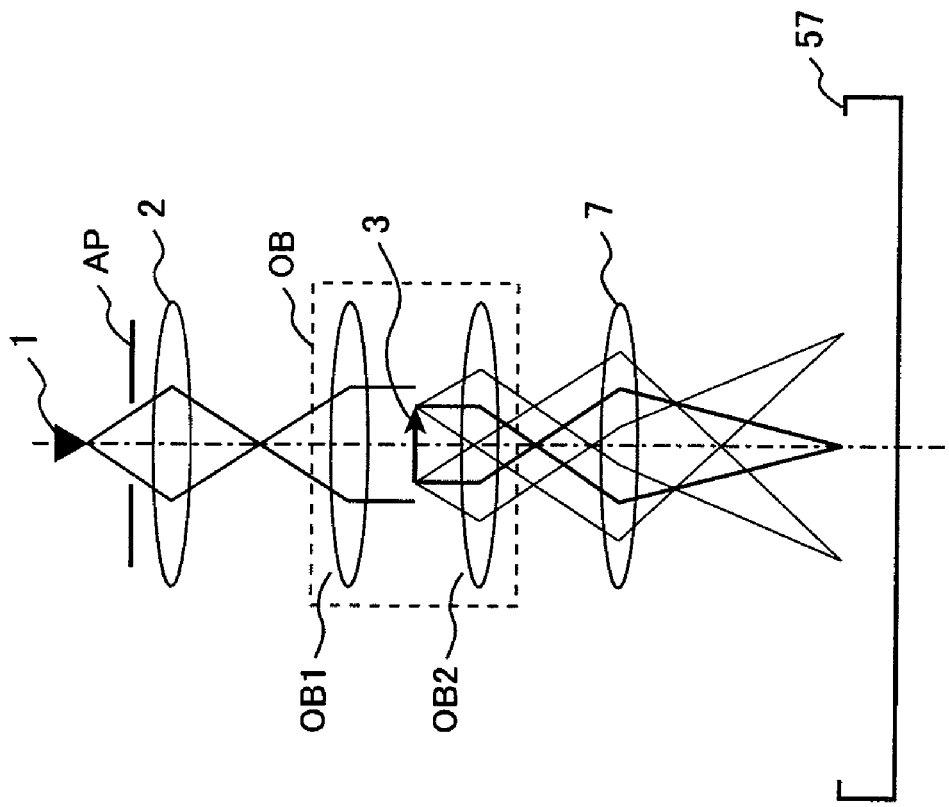

CHARGED PARTICLE BEAM EQUIPMENTS, AND CHARGED PARTICLE BEAM MICROSCOPE

CLAIM OF PRIORITY

The present application claims priority from Japanese patent application JP 2007-184084 filed on Jul. 13, 2007, the content of which is hereby incorporated by reference into this application.

BACKGROUND OF THE INVENTION

The present invention relates to charged particle beam equipment such as an electron microscope and an ion microscope.

For observation in an electron microscope and an ion microscope, a specimen is usually magnified through a lens. In this case, the resolution of a magnified image is restricted by aberrations of the lens, which results in two orders of magnitude decrease in resolution as compared to the wavelength of a beam. To address this problem, an aberration correction technique to reduce the aberration of the lens has been developed. However, there is a problem of increased cost of the equipment.

A phase retrieval method or a Fourier iterative phase retrieval method (R. W. Gerchberg and W. O. Saxton, "A practical algorithm for the determination of phase from image and diffraction plane pictures", Optik, vol. 35, pp. 237-246, 1972) is a method (hereinafter, referred to as "phase retrieval method" in this specification) for reconstructing an object image from a diffraction pattern.

A diffraction pattern can be obtained without using a lens, so that, in the phase retrieval method, it can be expected to observe an image with a high resolution and without the influence of the aberrations of the lens. In an X-ray technique where a lens can not be generally used, a technique for reproducing an object image from a diffraction pattern using the phase retrieval method has been advanced, which enables an image observation with a resolution of about the wavelength. Further, although a lens is used, an example of applying the phase retrieval method to an electron microscope has been reported (J. M. Zuo et al., "Atomic Resolution Imaging of a Carbon Nanotube from Diffraction Intensities", Science, Vol. 300, pp. 1419-1421, 2003).

BRIEF SUMMARY OF THE INVENTION

In order to explain a problem of the present invention, processing procedures of the phase retrieval method will be described.

<Explanation of the Principle of the Phase Retrieval Method>

An image observed by a microscope intrinsically contains information of its amplitude and phase. However, the observed intensity of the image is the square of the amplitude, and the phase information does not appear directly in a normal observation method. This fact is also true in an object space where an object image is observed and in a reciprocal space where a diffraction pattern is observed.

The object space and the reciprocal space have the following relation. That is, if the amplitude and phase information can be completely obtained in one of the spaces, the other one can be completely reproduced by the Fourier transform in a mathematical sense.

The phase retrieval method is a method to reconstruct an object image, in which a diffraction pattern is obtained by observation and the phase of the reciprocal space is obtained by calculation. In the calculation, the amplitude that is the square root of the observed diffraction pattern is set as a constraint condition of the reciprocal space, and some kind of constraint condition is set in the object space, so that the phase is reproduced little by little while repeating the Fourier transform and inverse Fourier transform.

For the following description, technical terms are defined as follows.

With respect to an image in the object space, three terms of "reconstructed image", "magnified image", and "object image" are used hereinafter. The "reconstructed image" represents an object space image in process of phase retrieval procedure, and the "magnified image" represents an image of the object space observed by a microscope. The "object image" essentially represents the whole image of the object space including the "reconstructed image" and the "magnified image". However, in order to clarify the explanation hereinafter, the final result obtained by the phase retrieval method is referred to as the "object image".

An iteration procedure will be schematically shown in FIG. 1.

As an initial condition, some kind of image (for example, a random pattern, a low resolution magnified image, or the like) is Fourier transformed to obtain information of an amplitude (F(k)) and a phase ($\phi$) in the reciprocal space. While the phase information is left as it is, the amplitude information is replaced by that (F'(k)) that is referred to as a constraint condition in the reciprocal space) of the diffraction pattern obtained by observation to perform the Fourier transform again (which is performed as the inverse Fourier transform with respect to the former Fourier transform). Among amplitude (f'(x)) information and the phase ($\phi$) information of the object space obtained by the inverse Fourier transform, while the phase information is left as it is, a result (f(x)) obtained by applying some kind of constraint condition (for example, the amplitude information except for the area of a specimen is set to 0) to the amplitude information is Fourier transformed. Among the obtained amplitude and phase information in the reciprocal space, while the phase information is left as it is, the amplitude is replaced by that of the diffraction pattern to perform the Fourier transform, thus obtaining the amplitude and phase information of the object space. By repeating this procedure, the phase information of the reciprocal space is reproduced. After sufficiently reproducing the phase information, the amplitude information of the diffraction pattern and the phase information are inverse Fourier transformed to reconstruct an object image.

Since the phases in both of the reciprocal space and the object space can be reproduced in process of the phase retrieval, it is possible to obtain the phase image of the object space by using the phase retrieval method. Further, it is possible to visualize an electric field and a magnetic field which are conventionally obtained by an electron beam holography or other methods.

<Explanation of a Method to Obtain a Diffraction Pattern and Explanation of a Camera Length>

A diffraction pattern can be obtained in such a manner that beams that are substantially parallel to each other are illuminated on a specimen and the beams that pass through the specimen (or reflected beams) are detected at a sufficiently-far position. Therefore, a lens is not essentially required on the back side (the side opposite to an optical source along the optical axis) of the specimen. At this time, a distance from the specimen to a detection plane is referred to as a camera length.

However, a lens effect of an objective lens on the back side of the specimen is generally utilized in an electron microscope, and the diffraction pattern formed at a back focal plane is magnified by a subsequent lens (projection lens). The camera length in this case is defined depending on a position apart from the specimen where the same diffraction spot intervals can be obtained in the case where the above-described lens is not present.

When the object image is reconstructed from the diffraction pattern by the procedure in FIG. 1, the diffraction pattern and the object image have the relation of the Fourier transform. Accordingly, an image size F of the object image to be reconstructed is obtained by following formula (1) using a camera length L, a pixel size p of a detector for detecting the diffraction pattern, and a wavelength λ of the electron beam determined on the basis of an acceleration voltage.

$$F = 2 \cdot \lambda \cdot L / p \quad (1)$$

However, in an electron microscope and an ion microscope to which the phase retrieval method is applied, the wavelength, the camera length, and the pixel size are changed due to the following reasons in accordance with the material of the specimen to be observed and the resolution to be required.

The energy (acceleration voltage) of the electron beam used in the electron microscope is selected in accordance with an object to be observed, so that the wavelength of the illumination beam is accordingly changed. For example, in order to obtain a higher resolution, the specimen is observed at an acceleration voltage of 200 kV, 300 kV, or more. When the beam illumination damage to the specimen is decreased or the contrast of a composition or a shape of the specimen is made clearer, an electron beam with an acceleration voltage of 30 kV or less is used.

A CCD, a film, an imaging plate, or the like is usually used for detection, and the size of a detection plane (a product of a pixel size and the number of pixels in the vertical and horizontal directions) is constant in many cases. It is desirable to change the size of the diffraction pattern in the detection plane in accordance with the resolution to be required, so that the camera length is changed in accordance with the resolution to be required.

In the case where the CCD, the film, the imaging plate, or the like can be switched for use as in a transmission electron microscope, a detection pixel size is different for each detector to be used. Further, in the case of the CCD camera, a method (binning) for detecting in units of plural pixels is used in some cases due to the data transfer rate and the saturated amount of detection.

Therefore, the image size F of the object image to be reconstructed by the Fourier transform is not constant and is changed for each observation condition.

On the other hand, the diffraction pattern reflects all information of a specimen area on which the beam is illuminated.

When the above-described observation condition is changed, the image size obtained by performing the Fourier transform for the diffraction pattern is accordingly changed. Thus, if the beam illumination on the specimen is constant, the specimen information forming the diffraction pattern is not equal to the object image reconstructed from the diffraction pattern.

As another problem, plural procedures are necessary in the electron microscope and the ion microscope to which the phase retrieval method is applied, and thus, it takes a lot of time until the object image is obtained. On the contrary, in a conventional electron microscope and a conventional ion microscope, changes in the image follow those in the observation condition such as changes in magnification ratio and movement of the specimen.

Therefore, when actually applying the phase retrieval method to the charged particle beam microscope, following way of observation is appropriate: a method using a normal lens is utilized for observing movement to determine the position of the specimen to be observed and for roughly observing a structure and the phase retrieval method is applied in the case of obtaining a higher resolution. However, time reduction in the object image reconstruction is practically required.

The following is a brief explanation of the representative summary of the invention disclosed in the present application to solve the above-described problem.

Specifically, charged particle beam equipment or a charged particle beam microscope of the present invention includes an illumination adjustment system which allows the area of a beam illuminated on a specimen for obtaining a diffraction pattern to have a certain relation with the image size of an object image to be reconstructed even in the case where the wavelength of the charged particle beam, a camera length at the time of obtaining the diffraction pattern, and the pixel size of a diffraction pattern detector are changed.

Further, charged particle beam equipment or a charged particle beam microscope of the present invention includes a deflector which scans a specimen with an illumination beam, and which allows a deflection width with which the specimen is scanned to have a certain relation with an image size determined by the wavelength of the charged particle beam, a camera length at the time of obtaining a diffraction pattern, and the pixel size of a diffraction pattern detector.

According to the charged particle beam equipment and the charged particle beam microscope of the present invention, the illumination area on the specimen for obtaining the diffraction pattern is substantially equal to the size of the image reconstructed by the phase retrieval method, so that the diffraction pattern is substantially equal, in a mathematical sense, to the object image to be reconstructed in just proportion of information. Further, the phase retrieval method is performed using the magnified image that has a certain relation, in size, with the image obtained by performing the Fourier transform for the diffraction pattern, so that the converge of the calculation becomes faster, and the accuracy is enhanced.

BRIEF DESCRIPTION OF THE DRAWINGS

FIGS. 2A and 2B are schematic diagrams showing main constituent elements of a scanning electron microscope according to a first embodiment;

FIGS. 4A and 4B are schematic diagrams showing main constituent elements of a transmission electron microscope according to a second embodiment;

DETAILED DESCRIPTION OF THE INVENTION

Figure 1:
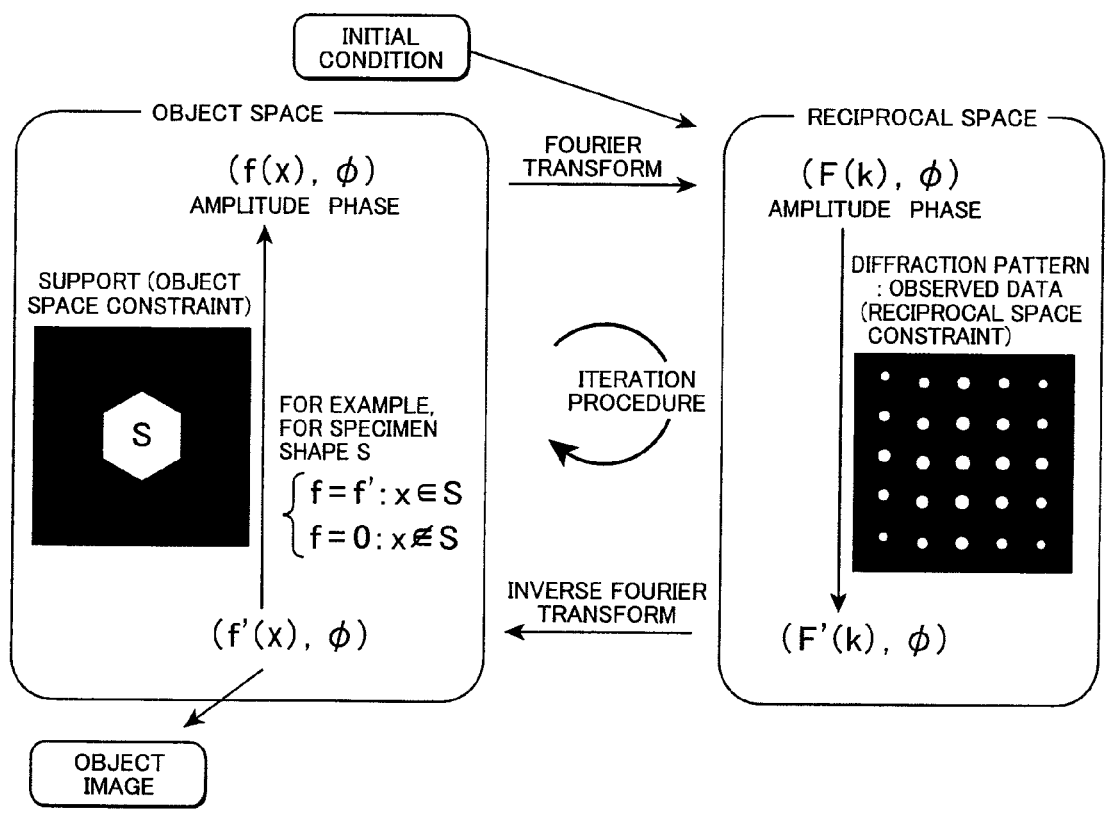
FIG. 1 is a diagram showing a processing procedure of a phase retrieval method.

Hereinafter, preferred embodiments will be described using the drawings.

The present invention can be applied to not only a scanning electron microscope, but also charged particle beam equipment such as a microscope using charged particles such as an electron microscope and an ion beam microscope including a transmission electron microscope.

First Embodiment

As an example of charged particle beam equipment, a scanning electron microscope (SEM) and a scanning transmission electron microscope (STEM) will be shown in a first embodiment.

<Explanation of Constituent Elements of a Scanning Electron Microscope and a Scanning Transmission Electron Microscope>

FIGS. 2A and 2B are schematic diagrams of a scanning electron microscope and a scanning transmission electron microscope according to the first embodiment. An electron beam emitted from an electron source 1 is illuminated on a specimen 3 through an illumination lens 2.

As shown in FIG. 2A, a magnified image is observed by displaying on an image display unit 105 in such a manner that the beam is converged on the specimen 3 through the illumination lens 2 and scanned on the specimen 3 or the vicinity of the specimen 3 by a deflector 4, and an electron beam 53, which passes through the specimen 3 and is detected by a transmission electron detector 51, or a secondary electron/reflection electron 54, which is generated from the specimen 3 and is detected by a secondary electron/reflection electron detector 52, is synchronized with a deflection signal of the deflector 4. It should be noted that a scanning transmission electron microscope (STEM) obtains an image with the beam which passes through the specimen using the transmission electron detector 51.

A high voltage power supply 101 controls an acceleration voltage, an extraction voltage and an extraction current of the electron source 1. An illumination lens control circuit 102 controls the intensity of the illumination lens 2, and a deflection signal control circuit 103 controls the deflector 4. The signal detected by the transmission electron detector 51 or the secondary electron/reflection electron detector 52 is amplified by an amplifier 61 and the amplified signal is synchronized with the deflection signal of the deflection signal control circuit 103 in an image processor 104 to be displayed on the image display unit 105 as a magnified image. The image synchronized with the deflection signal is also recorded into an image recording section 106. The high voltage power supply 101, the illumination lens control circuit 102, and the deflection signal control circuit 103 are controlled by an overall control system 110 that is a control unit for the whole equipment.

As shown in FIG. 2B, a diffraction pattern 55 is obtained in such a manner that parallel beams from the illumination lens 2 are illuminated on the specimen 3 and the diffraction pattern is detected by a diffraction pattern detector 56 which is located sufficiently apart from the specimen 3. A camera length L at this time is defined by a length between the specimen 3 and the diffraction pattern detector 56. The camera length L is adjusted by a projection lens 7. The projection lens 7 is controlled by a projection lens control circuit 107. The projection lens control circuit 107 is also controlled by the overall control system 110.

A CCD camera, an imaging plate, a film or the like is used for the diffraction pattern detector 56. The obtained diffraction pattern is digitized to be recorded into a diffraction recording section 62. The minimum unit of the digitized pattern is referred to as a pixel size p. In the case where a CCD camera is used, the pixel size p is the same as that of the CCD camera in some cases.

A phase retrieval process is performed for the recorded diffraction pattern in a computer 63, such as a personal computer, that is a processor for processing digital data. Here, the magnified image recorded into the image recording section 106 can be used as an initial condition or an object space constraint condition. A result of the phase retrieval process performed by the computer 63 is displayed on the image display unit 105. The magnified image recorded into the image recording section 106 may be displayed as it is on the image display unit 105.

As described above, the reconstructed image reconstructed by the phase retrieval method can be obtained by performing the Fourier transform for the diffraction pattern obtained by observation. Therefore, an image size F of the reconstructed image is determined by the formula (1). In the case where the phase retrieval process is performed while keeping the pixel size p at the time of obtaining the diffraction pattern, it is desirable to set an illumination area so as to be substantially equal to the image size F. In addition, it is possible to change the number of pixels of the image after obtaining the diffraction pattern. In this case, an effective pixel size at the time of performing the phase retrieval process is changed, and accordingly, the illumination area may be set so as not to be substantially equal to the image size F. Even in the case where the number of pixels of the image is changed after obtaining the diffraction pattern and a ratio to be changed is constant, the illumination area can be associated with the object image by setting the illumination area at a constant magnification ratio of the image size F if the acceleration voltage and the camera length are changed.

In order to realize this object, an illumination adjustment system 201 is provided in the embodiment so as to adjust a beam illumination area in the case where a wavelength λ of the electron beam, the camera length L, and the pixel size p are changed. The illumination adjustment system 201 obtains wavelength information of the illumination beam, camera length information, and pixel size information from the high voltage power supply 101, the projection lens control circuit 107, and the diffraction recording section 62, respectively, so as to set the illumination area corresponding to the image size determined by the formula (1), and transmits the control information to an aperture control circuit 202 to be described later, the illumination lens control circuit 102, and the deflection signal control circuit 103.

There are some methods for adjusting the illumination area. The respective adjustment methods will be described below.

FIG. 2A shows an adjustment system using an aperture AP. The aperture adjustment system 202 adjusts at least one of an opening size of the aperture AP, a position along an optical axis AX, and rotation in an aperture plane by using the control information from the illumination adjustment system 201.

Although the opening of the aperture is usually circular in shape, it is desirable that the illumination area on the specimen is rectangular in shape in order to correspond to the diffraction pattern. Therefore, the opening of the aperture AP can be set to have a rectangular shape. In addition, it is desirable that the aperture AP has a rotation mechanism in the aperture plane so that the opening of the aperture can be rotated on the specimen.

Figure 3:
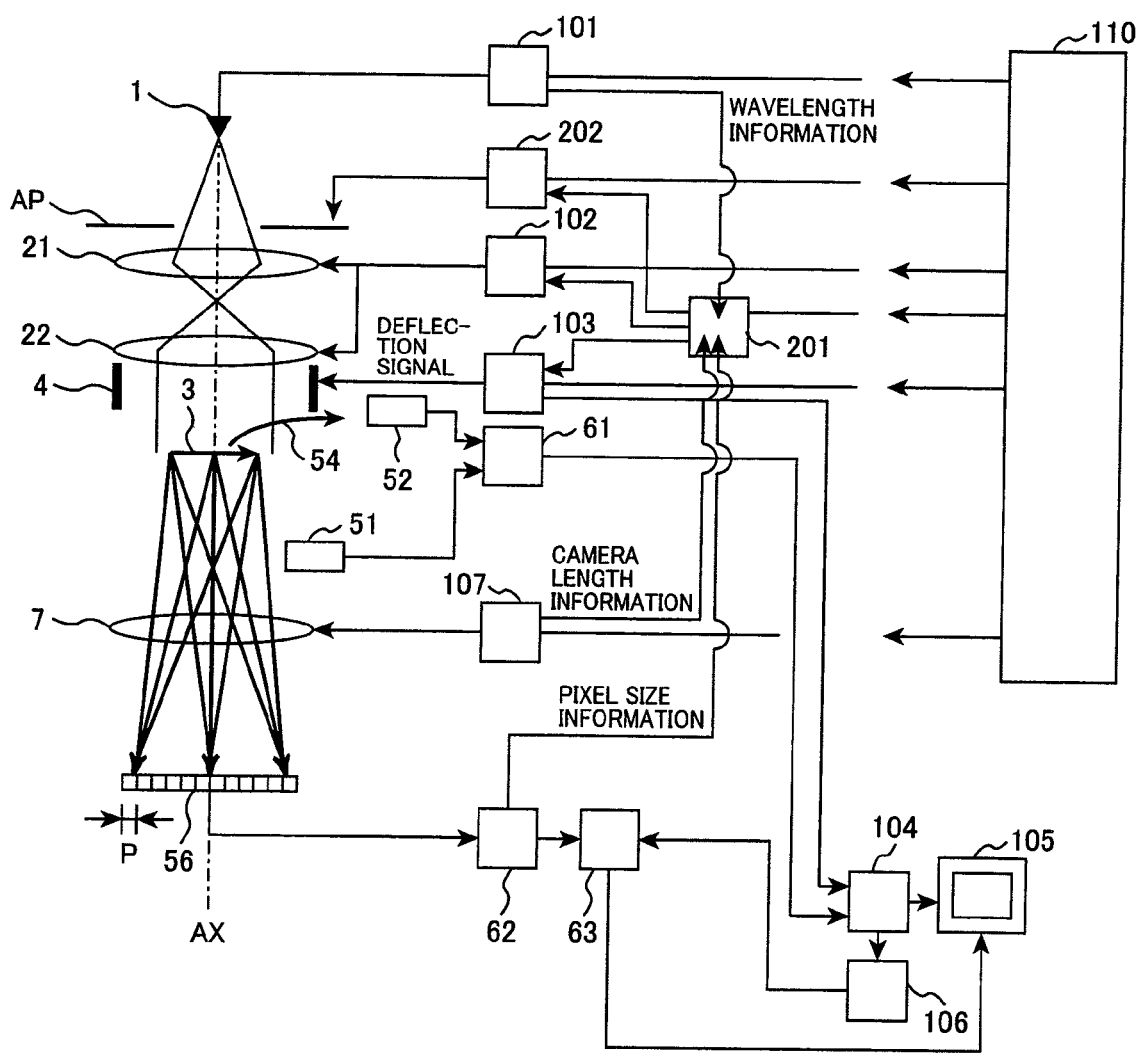
FIG. 3 is a diagram showing a case in which an illumination area on a specimen is specified by two illumination lenses in the first embodiment.

FIG. 3 shows an adjustment system configured by plural illumination lenses (a first illumination lens 21 and a second illumination lens 22). The control information from the illumination adjustment system 201 is transmitted to the illumination lens control circuit 102, and the illumination area is adjusted by controlling the first illumination lens 21 and the second illumination lens 22.

These adjustment systems allow the illumination area of the diffraction pattern to be obtained to be associated with the image size of the phase retrieval result, so that the diffraction pattern is substantially equal, in a mathematical sense, to the reconstructed image in just proportion of information.

Further, in the case where the phase retrieval method is applied to the scanning electron microscope (SEM) as in the embodiment, it is preferable to observe the specimen as with a normal SEM up to a certain level of resolution (magnification), and to use the phase retrieval method when further increasing the resolution.

The effectiveness of using the low resolution magnified image as the initial condition and the object space constraint condition in the phase retrieval process has already been proposed in International Publication No. WO2005/114693A1.

When the diffraction pattern is obtained and the phase retrieval method is applied, the magnified image that is substantially equal in size to the image obtained by performing the Fourier transform for the diffraction pattern is used, so that the magnified image can be applied to the calculation as it is, and a calculation process can be performed at a high speed. Further, since the phase retrieval image and the image obtained by the SEM observation have a good relation in continuity, a user can observe with the feeling of less discomfort.

In order to realize this object, there is an effective method in which the control information from the illumination adjustment system 201 is reflected on the deflector 4 used when obtaining the magnified image in FIG. 2A. As apparent from FIG. 2A, the control information from the illumination adjustment system 201 is transmitted to the deflection signal control circuit 103 to change at least one of the deflection width and the deflection rotation of the deflector 4, and to adjust the illumination area on the specimen so as to correspond to the reconstructed image. Accordingly, it is possible to perform the phase retrieval method using the magnified image that is substantially equal in size to the image obtained by performing the Fourier transform for the diffraction pattern, the converge of the calculation becomes faster, and the accuracy is enhanced.

In the first embodiment described above, the illumination adjustment system 201 which transmits the control information to the aperture control circuit 202, the illumination lens control circuit 102, and the deflection signal control circuit 103 is provided separately from the overall control system 110 that is an overall control unit. However, it is obvious that the function of the illumination adjustment system 201 may be included in the overall control system 110. In this case, the wavelength information, the camera length information, and the pixel size information to be required are transmitted to the overall control system 110, and the overall control system 110 generates the control information to the aperture control circuit 202.

Second Embodiment

Next, an example of application to a transmission electron microscope (TEM) will be described as a second embodiment.

<Example of Application to a Transmission Electron Microscope>

FIGS. 4A and 4B are schematic diagrams, each showing a transmission electron microscope according to a second embodiment. The electron beam emitted from the electron source 1 is illuminated on the specimen 3 through the illumination lens 2 and a front-field lens effect OB1 of the objective lens. Under the same illumination optical condition in the transmission electron microscope, the diffraction pattern can be obtained (FIG. 4A) and the magnified image can be observed (FIG. 4B).

In the case where the magnified image is observed, the specimen image is magnified about ten times by a back-field lens effect OB2 of the objective lens, and the magnified image is further magnified and projected on a detection plane 57 by the projection lens 7, as shown in FIG. 4B. In general, the lens effects OB1 and OB2 are collectively referred to as the objective lens OB.

On the other hand, in the case where the diffraction pattern is obtained, the diffraction pattern formed on a back focal plane of the back-field lens effect OB2 of the objective lens is magnified and projected on the detection plane 57 by the projection lens, as shown in FIG. 4A.

By providing plural projection lenses 7, the magnification ratio of the back-side focal plane can be changed. In this case, a camera length L' can be obtained by converting a diffraction spot interval d in the detection plane 57 into a case in which the diffraction pattern is obtained without using a lens.

In the case where the wavelength λ of the electron beam, the camera length L' and the pixel size p are changed by the observation condition, the beam illumination area on the specimen can be adjusted by changing the intensities of the illumination lens 2 and the front-field lens effect OB1 of the objective lens 2 using the illumination adjustment system, as similar to the first embodiment.

Figure 5:
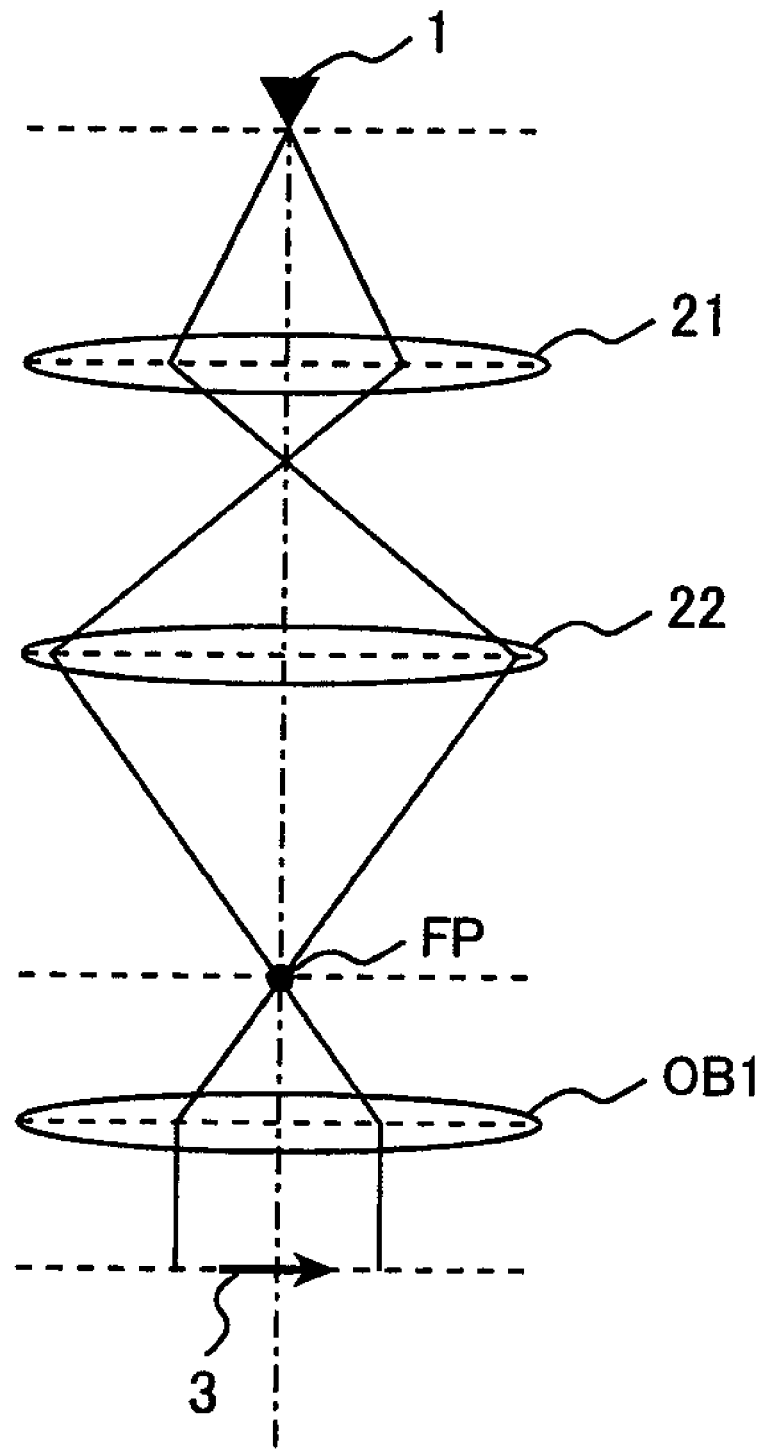
FIG. 5 is a diagram showing a case in which an illumination area on a specimen is specified by two illumination lenses in the second embodiment.

Further, when the first illumination lens 21 and the second illumination lens 22 are provided as a two-stage configuration to immobilize a focal point FP of the second illumination lens 22, the beam illumination area on the specimen 3 can be adjusted by adjusting the first illumination lens 21 and the second illumination lens 22 while keeping constant the condition of the objective lens OB. In FIG. 5, the constituent elements subsequent to the back-field lens effect OB2 of the objective lens are omitted.

The shape of the beam illumination area on the specimen 3 can be set depending on the opening shape of the aperture AP, as similar to the first embodiment. In this case, it is desirable that a conjugate image of the aperture AP is formed on the specimen 3. As similar to the first embodiment, it is desirable that the aperture AP has a rotation mechanism in the aperture plane so as to rotate the opening shape of the aperture on the specimen.

<Explanation of an Example of Graphical User Interface when Applying the Phase Retrieval Method>

Figure 6:
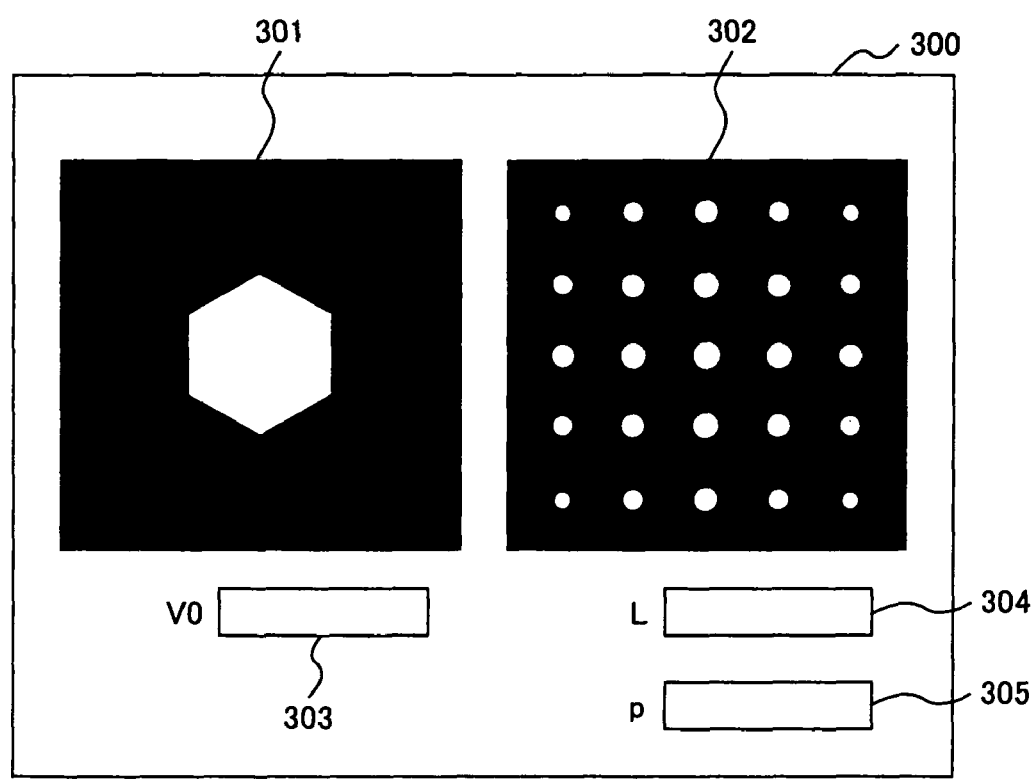
FIG. 6 is a diagram showing an example of a graphical user interface when the phase retrieval method is applied in the embodiments.

FIG. 6 is an example of a Graphical User Interface (GUI) in the electron microscope of each of the first and second embodiments. A graphical user interface 300 is included in the overall control system 110 shown in each of FIGS. 2A and 3, and includes an object space image display unit 301 and a diffraction pattern display unit 302. The magnified image, the reconstructed image in process of the phase retrieval, and the object image as a final result (the images displayed on the image display unit 105 in each of FIGS. 2A and 3) are displayed on the object space image display unit 301, and the diffraction pattern obtained by observation (the image recorded into the diffraction recording section 62 in each of FIGS. 2A, 2B and 3) is displayed on the diffraction pattern display unit 302.

The graphical user interface 300 further includes an acceleration voltage display unit 303, a camera length display unit 304, and a pixel size display unit 305 which respectively display the acceleration voltage of the illumination beam, the camera length, and the pixel size of the diffraction pattern detector. These values indicate the acceleration voltage information, the camera length information, and the pixel size information in the high voltage power supply 101, the projection lens control circuit 107, and the diffraction recording section 62 in each of FIGS. 2A, 2B and 3. The acceleration voltage, the camera length, and the pixel size can be input by a user, and these input values can be transmitted to the illumination adjustment system 201 to be reflected on the illumination condition.

In the above explanation, the graphical user interface 300 is included in the overall control system 110 shown in each of FIGS. 2A and 3. However, it is obvious that the image display unit 105 shown in each of FIGS. 2A and 3 can be configured to display the graphical user interface 300.

What is claimed is:

1. Charged particle beam equipment comprising:
a charged particle beam source;
a charged particle optical system which illuminates a charged particle beam generated from the charged particle beam source on a specimen;
a diffraction pattern detector which detects the intensity of a diffraction pattern generated from the specimen;
a computer which reconstructs an object image from the intensity of the diffraction pattern; and
an illumination adjustment system which determines the size of an illumination area of the charged particle beam illuminated on the specimen on the basis of the size of the object image reconstructed by the computer wherein the illumination adjustment system determines the size of an illumination area according to at least one of the wavelength $\lambda$ of the charged particle beam, a camera length L at the time of obtaining the diffraction pattern, and the pixel size p of the diffraction pattern detector to determine the size of the illumination area, wherein the size of the illumination area is determined by the formula $F=2\cdot\lambda\cdot L/p$.

2. The charged particle beam equipment according to claim 1,
wherein the illumination adjustment system allows the illumination area of the charged particle beam to be substantially equal in size to the reconstructed object image.

3. The charged particle beam equipment according to claim 1,
wherein the charged particle optical system includes an aperture, and the illumination adjustment system adjusts at least one of the size, position and rotation of an opening portion of the aperture.

4. The charged particle beam equipment according to claim 1,
wherein the charged particle optical system includes a plurality of charged particle beam lenses, and the illumination adjustment system adjusts the intensities of the plural charged particle beam lenses.

5. The charged particle beam equipment according to claim 1,
wherein the charged particle optical system includes a deflector, and the illumination adjustment system adjusts at least one of the deflection width and deflection direction of the deflector.

6. The charged particle beam equipment according to claim 1,
wherein the computer uses a phase retrieval method when reconstructing the object image from the intensity of the diffraction pattern.

7. A charged particle beam microscope comprising:
a charged particle beam source;
a charged particle optical system which illuminates a charged particle beam generated from the charged particle beam source on a specimen;
a deflector which scans the specimen with the charged particle beam;
a charged particle detector which detects a secondary charged particle or a transmission charged particle generated from the specimen;
a diffraction pattern detector which detects the intensity of a diffraction pattern generated from the specimen;
a processor which reconstructs an object image from the intensity of the diffraction pattern detected by the diffraction pattern detector;
an illumination adjustment system which determines the size of an illumination area of the charged particle beam illuminated on the specimen on the basis of the size of the reconstructed object image; and
an image display unit which displays an image based on an output from the charged particle detector or the diffraction pattern detector wherein the illumination adjustment system determines the size of an illumination area according to at least one of the wavelength $\lambda$ of the charged particle beam, a camera length L at the time of obtaining the diffraction pattern, and the pixel size p of the diffraction pattern detector, so as to allow the illumination area to be substantially equal in size to the reconstructed object image, wherein the size of the illumination area is determined by the formula $F=2\cdot\lambda\cdot L/p$.

8. The charged particle beam microscope according to claim 7,
wherein the illumination adjustment system adjusts the size of the illumination area of the charged particle beam illuminated on the specimen so as to be substantially equal to the size of the reconstructed object image.

9. The charged particle beam microscope according to claim 7, wherein
the processor uses a phase retrieval method when reconstructing the object image from the intensity of the diffraction pattern.

10. A charged particle beam microscope comprising:
a charged particle beam source;
a charged particle optical system which illuminates a charged particle beam generated from the charged particle beam source on a specimen and which includes an illumination lens and an objective lens;
a detector which detects a diffraction pattern or a magnified image of the specimen generated by illumination of the charged particle beam;
a projection lens which magnifies and projects the diffraction pattern or the magnified image to the detector;
an image display unit which displays an image based on an output from the detector;
a processor which reconstructs an object image from the intensity of the diffraction pattern output by the detector; and
an illumination adjustment system which determines the size of an illumination area of the charged particle beam illuminated on the specimen on the basis of the size of the reconstructed object image wherein the illumination adjustment system determines the size of an illumination area according to at least one of the wavelength $\lambda$ of the charged particle beam, a camera length L at the time of obtaining the diffraction pattern, and the pixel size p of the diffraction pattern detector, so as to allow the illumination area to be substantially equal in size to the reconstructed object image, wherein the size of the illumination area is determined by the formula $F=2\cdot\lambda\cdot L/p$.

11. The charged particle beam microscope according to claim 10,
wherein the illumination adjustment system adjusts the size of the illumination area of the charged particle beam illuminated on the specimen so as to be substantially equal to the size of the reconstructed object image.

12. The charged particle beam microscope according to claim 10,
wherein the processor uses a phase retrieval method to reconstruct the object image from the intensity of the diffraction pattern.

* * * * *